(12) United States Patent
Jaulerry

(10) Patent No.: US 9,612,617 B1
(45) Date of Patent: Apr. 4, 2017

(54) WEARABLE COMPUTING DEVICE FOR MANAGING AND STORING DATA

(71) Applicant: Guillaume Jaulerry, Miami, FL (US)

(72) Inventor: Guillaume Jaulerry, Miami, FL (US)

( * ) Notice: Subject to any disclaimer, the term of this patent is extended or adjusted under 35 U.S.C. 154(b) by 0 days.

(21) Appl. No.: 15/046,613

(22) Filed: Feb. 18, 2016

(51) Int. Cl.
| | | |
|---|---|---|
| *G06F 1/16* | (2006.01) | |
| *G11C 11/417* | (2006.01) | |
| *G11C 11/401* | (2006.01) | |
| *G04B 37/14* | (2006.01) | |
| *G04G 21/08* | (2010.01) | |
| *G04G 19/00* | (2006.01) | |
| *G04B 37/08* | (2006.01) | |
| *G01R 31/36* | (2006.01) | |
| *H02J 7/02* | (2016.01) | |

(52) U.S. Cl.
CPC ......... *G06F 1/163* (2013.01); *G01R 31/3682* (2013.01); *G04B 37/08* (2013.01); *G04B 37/1486* (2013.01); *G04G 19/00* (2013.01); *G04G 21/08* (2013.01); *G11C 11/401* (2013.01); *G11C 11/417* (2013.01); *H02J 7/025* (2013.01)

(58) Field of Classification Search
None
See application file for complete search history.

(56) References Cited

U.S. PATENT DOCUMENTS

| | | | | |
|---|---|---|---|---|
| 4,432,655 A | * | 2/1984 | Wollman | G04B 37/1486 224/164 |
| 5,206,841 A | * | 4/1993 | Boucheron | G04B 37/005 368/276 |
| 5,889,737 A | * | 3/1999 | Alameh | G04C 10/00 368/204 |
| 6,158,884 A | * | 12/2000 | Lebby | G04B 47/00 224/165 |
| 6,549,791 B1 | * | 4/2003 | Jeon | H04B 1/385 379/433.08 |
| 6,874,931 B2 | * | 4/2005 | Noirjean | A44C 5/0007 368/204 |
| 8,908,479 B2 | * | 12/2014 | Teng | G04G 19/02 368/204 |
| 9,357,817 B2 | * | 6/2016 | Lee | A44C 5/14 |
| 2004/0092874 A1 | * | 5/2004 | Mazidji | A44C 5/0023 604/136 |
| 2010/0331167 A1 | * | 12/2010 | Ohta | C04B 35/58007 501/96.1 |
| 2013/0322217 A1 | * | 12/2013 | Aizawa | G04R 60/10 368/14 |

(Continued)

*Primary Examiner* — Steven H Nguyen

(74) *Attorney, Agent, or Firm* — Mark Terry

(57) ABSTRACT

The disclosed embodiments present a wearable computing device for storing and managing data. The wearable computing device includes a wristband including a hermetically sealed rechargeable battery, a ferromagnetic shaft coupled to one end of the wristband, and a case comprising a waterproof housing. The case is configured for holding a cylinder shaped for securely inserting the shaft into said cylinder, various wireless communications processors, a memory element, a data storage device, an inductive charging system, and a processor for receiving and storing data, and for receiving status data. The wearable computing device also includes a touch-sensitive display located on an external surface of the case, the display configured to display said status data.

20 Claims, 20 Drawing Sheets

(56) References Cited

U.S. PATENT DOCUMENTS

| | | | |
|---|---|---|---|
| 2015/0120020 A1* | 4/2015 | Armstrong | G04G 17/08 700/91 |
| 2015/0189134 A1* | 7/2015 | Joo | G06F 1/163 348/373 |
| 2015/0241916 A1* | 8/2015 | Choi | G06F 1/163 361/679.03 |
| 2015/0297134 A1* | 10/2015 | Albert | A61B 5/681 600/384 |
| 2015/0313542 A1* | 11/2015 | Goldberg | A61B 5/0205 600/384 |
| 2015/0333302 A1* | 11/2015 | Johns | H01M 2/1066 429/127 |
| 2015/0348009 A1* | 12/2015 | Brown | G06Q 20/3227 705/16 |
| 2016/0040698 A1* | 2/2016 | Perkins | A44B 17/0011 24/664 |
| 2016/0058375 A1* | 3/2016 | Rothkopf | A61B 5/681 600/301 |
| 2016/0077548 A1* | 3/2016 | Lim | G06F 1/166 361/679.26 |
| 2016/0106370 A1* | 4/2016 | Filipovic | A61B 5/6898 340/870.07 |
| 2016/0174857 A1* | 6/2016 | Eggers | A61B 5/02438 600/301 |
| 2016/0255944 A1* | 9/2016 | Baranski | A45F 5/00 |

* cited by examiner

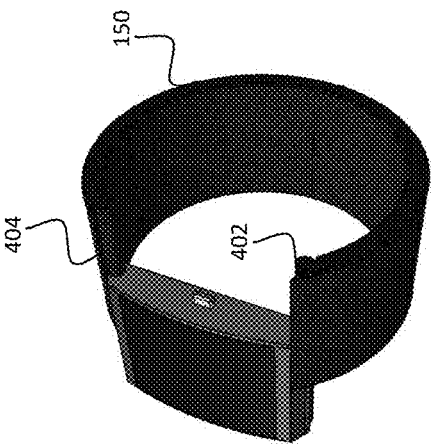
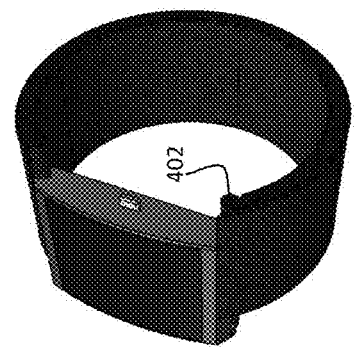
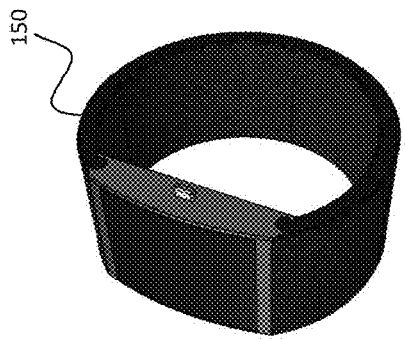
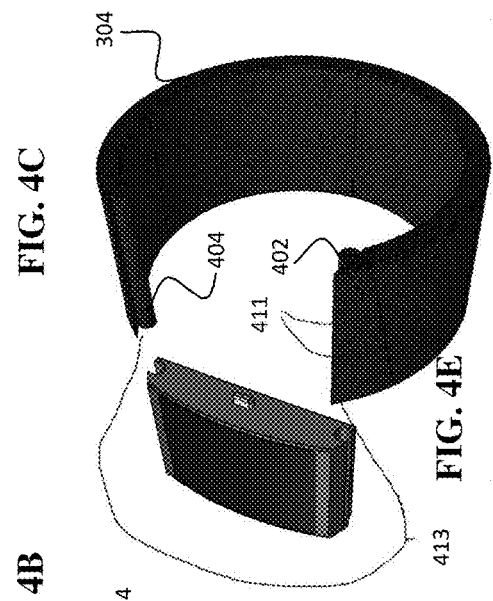
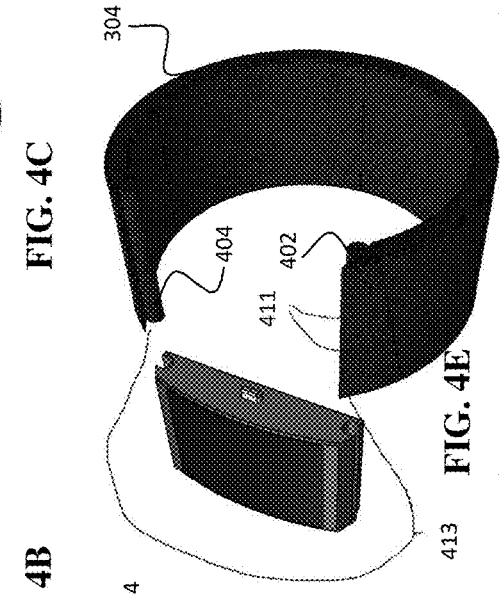
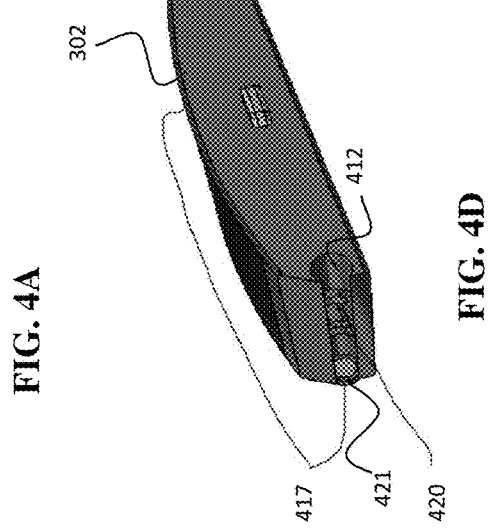

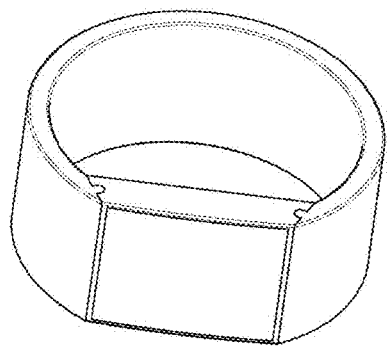
FIG. 7F
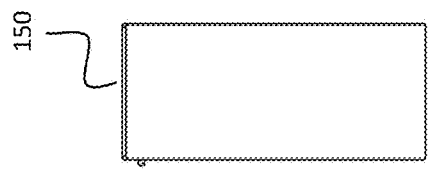
FIG. 7E
FIG. 7D
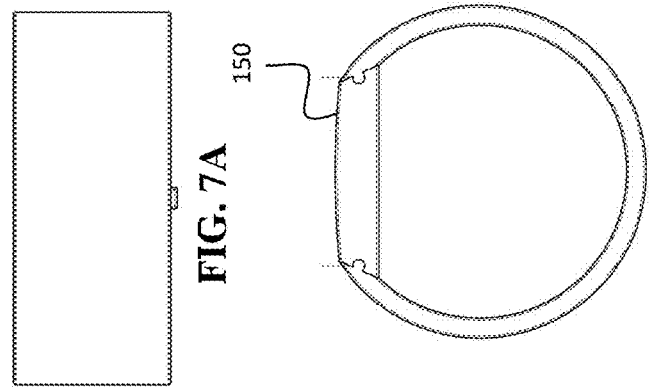
FIG. 7A
FIG. 7C
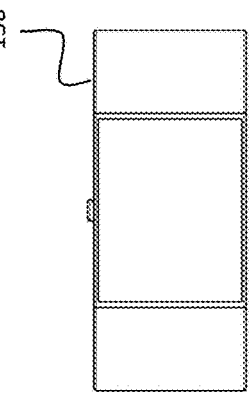
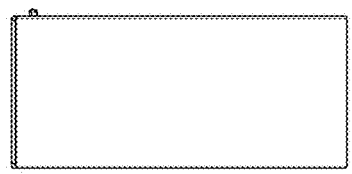
FIG. 7B

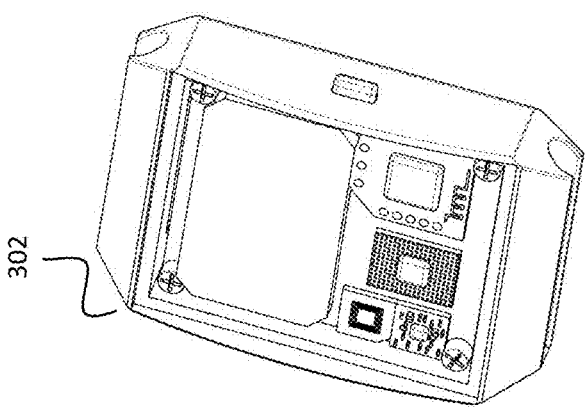
FIG. 8F
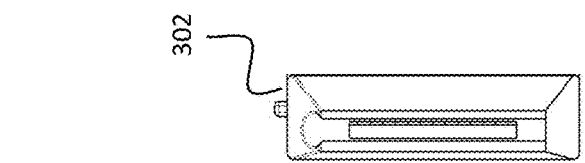
FIG. 8E
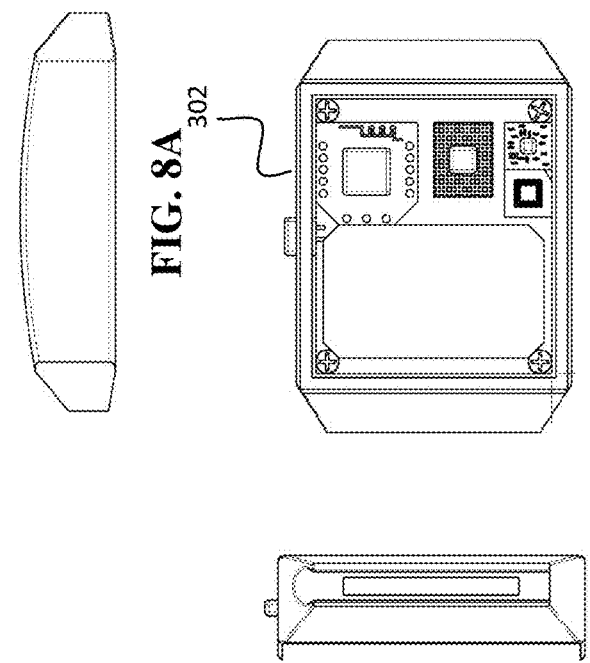
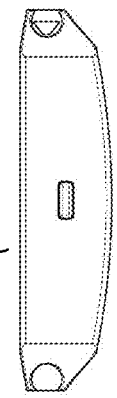
FIG. 8A  FIG. 8C  FIG. 8D
FIG. 8B

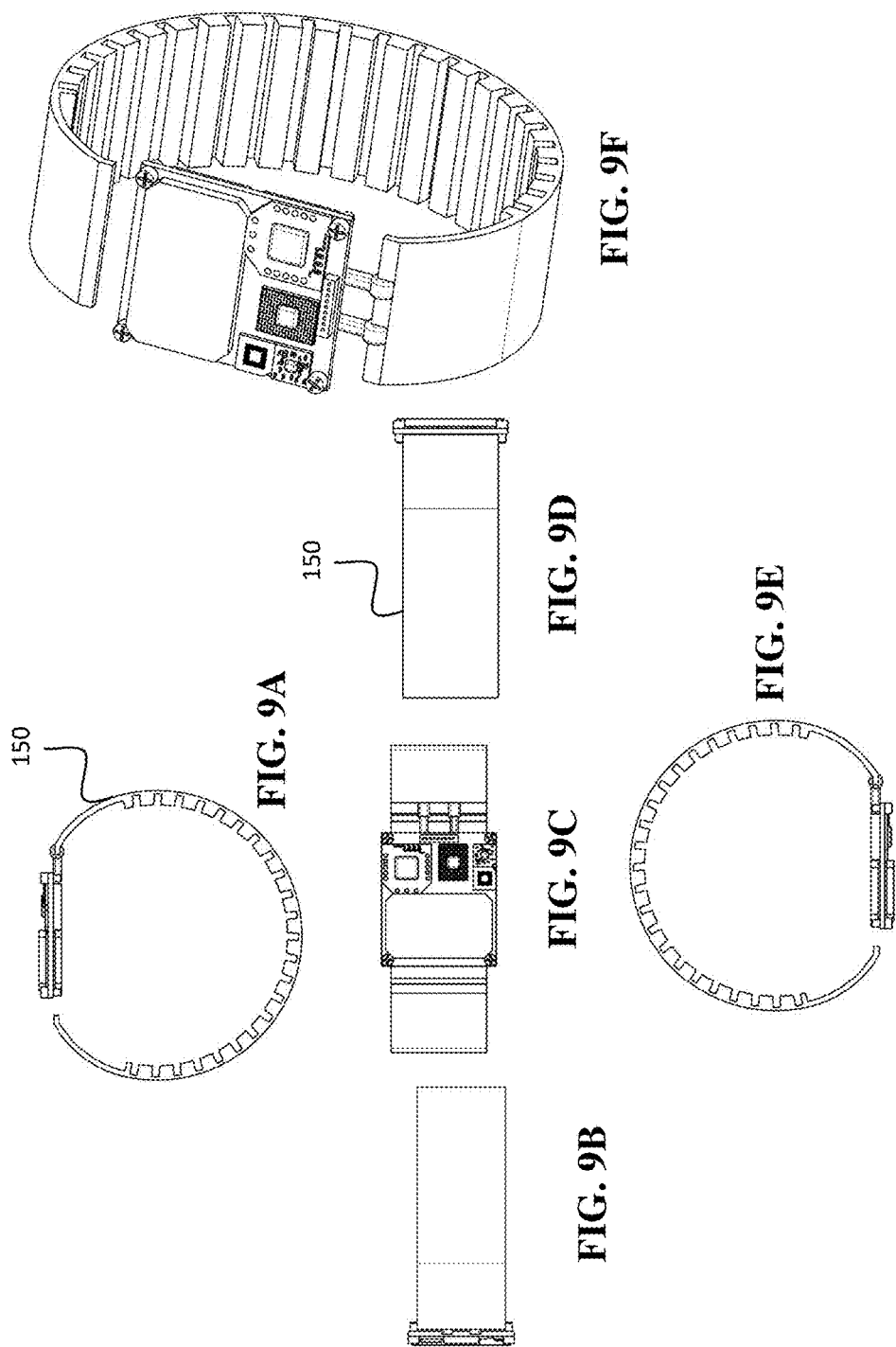

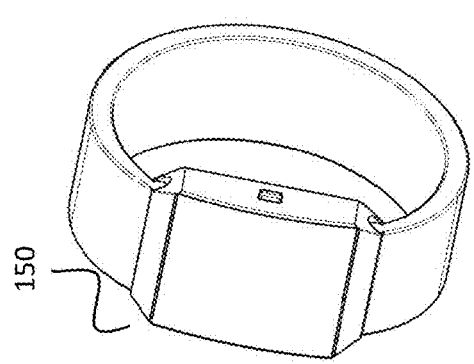
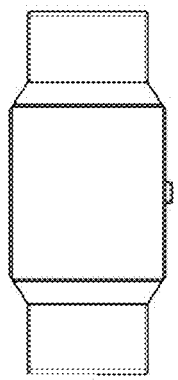
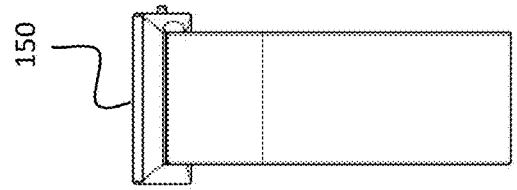
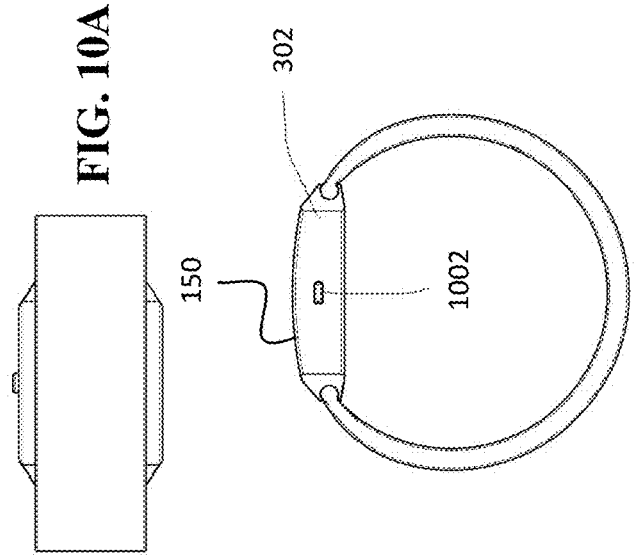
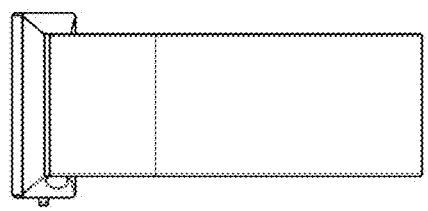

WEARABLE COMPUTING DEVICE FOR MANAGING AND STORING DATA

CROSS-REFERENCE TO RELATED APPLICATIONS

Not Applicable.

STATEMENT REGARDING FEDERALLY SPONSORED RESEARCH OR DEVELOPMENT

Not Applicable.

INCORPORATION BY REFERENCE OF MATERIAL SUBMITTED ON A COMPACT DISC

Not Applicable.

TECHNICAL FIELD

The disclosed embodiments relate to the field of data storage and, more specifically, the disclosed embodiments relate to the field of data storage devices on wearable computing devices.

BACKGROUND

With the emergence of small and mobile computing devices, the U.S. population, as well as the population of most developed countries has become increasingly mobile. Business persons frequently work on the road, law enforcement officers collect and upload data in the field, technicians (such as underground detecting personnel) perform their duties in the outdoors and students study and learn in out-classroom environments. In addition, cloud data storage and network accessible services, such as social networks and mail servers, have become increasing popular. Consequently, many individuals today have a daily need to remotely access data that is located in another place, while said individuals are on the go. This has led to a variety of problems.

First, there is typically a finite amount of cloud storage space available through a cloud data storage provider. Increasing the amount of cloud data storage space desired usually results in greater fees, which can be cost prohibitive. Second, could data storage is only as reliable as the network connection of the consumer. When the consumer is located in a place with no network connection or a bad connection, the consumer will have little or limited access to his data on the cloud. This is a common problem for law enforcement in the field, and technicians performing their duties in the outdoors. Third, there is an increasingly prevalent issue with the security of cloud based data storage. Several high profile security break-ins of cloud based data storage facilities have brought this problem to the forefront for consumers. Fourth, current solutions for taking a consumer's data on a mobile device have suffered from data safety issues, namely, the safety of the device on which the data is stored. Computing devices often break down or simply malfunction when exposed to water, vapor, or high and low temperatures. This has resulted in consumers being timid in bringing their important data with them on mobile devices when in a rugged situation. Fifth, and finally, there is a well-known problem that has arisen with file format compatibility among different file systems, which is particularly topical in cloud storage environments. This problem causes lost time and annoyance to consumers.

Therefore, a need exists to overcome the problems with the prior art, and more specifically, there is a need for a more efficient and improved system and method for managing and storing data.

BRIEF SUMMARY

The disclosed embodiments present a wearable computing device for storing and managing data. The wearable computing device includes a wristband including a hermetically sealed rechargeable battery within said wristband, a ferromagnetic shaft coupled to one end of the wristband, the shaft shaped for removable insertion into a cylinder, at least one terminal conductively coupled with the battery, and extending to the shaft, such that the at least one terminal is exposed on an external surface of the shaft and a case comprising a waterproof housing. The case is configured for holding a cylinder shaped for securely inserting the shaft into said cylinder, the cylinder comprising at least one magnet for attracting the shaft, and at least one terminal for making a conductive connection with the at least one terminal conductively coupled with the battery when the shaft is inserted into the cylinder, a first communications processor configured for wirelessly transmitting and receiving data over radio frequency signals defined by the IEEE 802.11 standard, a second communications processor configured for wirelessly transmitting and receiving data over radio frequency signals defined by the IEEE 802.15.1 standard, a third communications processor configured for wirelessly transmitting and receiving data over radio frequency signals defined by the ISO/IEC 18092 standard, a memory element comprising at least 2 gigabytes of memory, a data storage device comprising at least 30 gigabytes of data storage, an inductive charging system conductively coupled with the battery when the shaft is inserted into the cylinder, such that the inductive charging system wirelessly receives charge from an external power source and recharges the battery and, a processor conductively coupled with the first, second and third communications processor, the memory element, the data storage element, and the battery. The processor is configured for receiving a first data set from the first, second or third communications processors, wherein said first data set originated from an external node, and storing said first data set in the data storage device, accessing a second data set from the data storage device, in response to a request for said second data set from the first, second or third communications processors, and sending said second data set to the first, second or third communications processors, wherein the said second data set is wirelessly transmitted by the first, second or third communications processors to an external node and, receiving status data from the first, second and third communications processors, the data storage device, and the battery. The wearable computing device also includes a touch-sensitive display located on an external surface of the case, the display conductively coupled with the battery and the processor so as to receive status data from the processor, wherein the display is configured to display said status data.

Additional aspects of the disclosed embodiments will be set forth in part in the description which follows, and in part will be obvious from the description, or may be learned by practice of the claimed device. The aspects of the disclosed embodiments will be realized and attained by means of the elements and combinations particularly pointed out in the appended claims. It is to be understood that both the foregoing general description and the following detailed description are exemplary and explanatory only and are not restrictive of the disclosed embodiments, as claimed.

BRIEF DESCRIPTION OF THE SEVERAL VIEWS OF THE DRAWINGS

The accompanying drawings, which are incorporated in and constitute part of this specification, illustrate embodiments of the claimed device and together with the description, serve to explain the principles of the claimed device. The embodiments illustrated herein are presently preferred, it being understood, however, that the claimed device is not limited to the precise arrangements and instrumentalities shown, wherein:

FIGS. 4A-4E are renderings of a wearable device for storing and managing data, during the fastening process, in accordance with one embodiment.

FIGS. 7A-7F are illustrations of various views of a wearable device for storing and managing data, in accordance with one embodiment.

FIGS. 8A-8F are illustrations of various views of a wearable device for storing and managing data, showing certain interior components, in accordance with one embodiment.

FIGS. 9A-9F are illustrations of various views of a wearable device for storing and managing data, showing certain interior components, in accordance with one embodiment.

FIGS. 10A-10F are illustrations of various views of a wearable device for storing and managing data, showing certain interior components, in accordance with one embodiment.

DETAILED DESCRIPTION

Figure 1A:
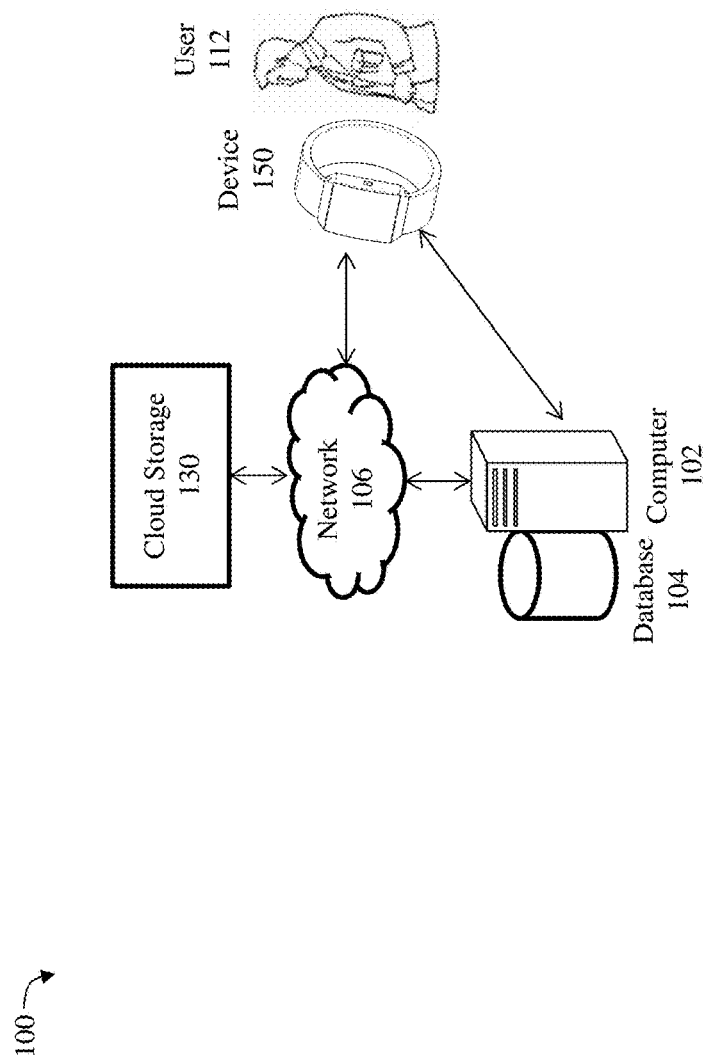
FIG. 1A is a block diagram illustrating the network architecture of a system for use with the wearable device for storing and managing data, in accordance with one embodiment.

The following detailed description refers to the accompanying drawings. Wherever possible, the same reference numbers are used in the drawings and the following description to refer to the same or similar elements. While embodiments of the claimed device may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the claimed device. Instead, the proper scope of the claimed device is defined by the appended claims.

The disclosed embodiments improve upon the problems with the prior art by providing a device and system that allows consumers to mobilize their important data so as to bring it with them in mobile environments safely and securely. The disclosed embodiments improve over the prior art by providing a mobile wearable device that stores and manages data for mobile business persons, law enforcement officers, technicians and students in mobile environments. The disclosed embodiments also provide a large amount of storage space, which addresses the small finite amount of cloud storage space available through conventional cloud data storage providers. The disclosed embodiments also eliminate the need for a reliable network connection when the consumer is located in a place with no network connection or a bad connection, since the data is stored locally. The disclosed embodiments further provide a high amount of security of the stored data, due to the wearable nature of the device and the close proximity needed to access the device. Also, the disclosed embodiments provide a safe and rugged device on which the data is stored, eliminating or reducing the chances that the device may break down or simply malfunction when exposed to water, vapor, or high and low temperatures. Lastly, the disclosed embodiments reduce or eliminate common file format compatibility problems among different file systems, which is a particularly frequent issue in cloud storage environments.

Referring now to the drawing figures in which like reference designators refer to like elements, there is shown in FIG. 1A an illustration of a block diagram showing the network architecture of a system 100 for use with the wearable device 150 for storing and managing data. FIG. 1A shows consumer 112 can access the network 106 via his wearable device 150, which may perform many of the same functions as a mobile computing device, smart phone, mobile phone, handheld computer, laptop, desktop computer, a game console, server, workstation, computer terminal, workstation, or the like. FIG. 1A further shows various components coupled with network 106, which can be a circuit switched network, such as the Public Service Telephone Network (PSTN), or a packet switched network, such as the Internet or the World Wide Web, the global telephone network, a cellular network, a mobile communications network, or any combination of the above. Connected to network 106 is computer 102, which can store data accessible to consumer 112 either over communications network 106 or in direct connection with the device 150, as described in greater detail below. Also connected to network 106 is cloud data store provider 130, which may be a corporation, company, business association or firm that provides commercial cloud data storage services. Nodes 102, 130 and 150 may each include a software engine that delivers applications, data, program code and other information to networked computing devices. Examples of nodes 102, 130 and 150 are described in greater detail below with reference to FIG. 15. Note that is in this application, the term "consumer" refers to an individual 112, as shown in FIG. 1A, or a corporation, company, business association or firm.

FIG. 1A further shows a database or repository 104, which may be a relational database comprising a Structured Query Language (SQL) database stored in a SQL server. The repository 104 serves data from a database, which is a repository for data used by computer 102 and device 150 during the course of operation of the disclosed embodiments. Database 104 may be distributed over one or more nodes or locations that are connected via network 106.

The database 104, as well as any data repository within device 150, may include consumer records, which are records that contain the details of a consumer or user 112. A consumer record may include: a unique consumer identifier, contact/identifying information for the consumer or passenger (name, address, telephone number(s), email address, etc.), additional user contact details, login data, password, login, username, the user's gender, user passport details, date and place of birth, all available payment/billing information and one or more references to another record, such as a unique record identifier.

It should be noted that although FIG. 1A shows only computer 102, one database 104, one device 150, one consumer 112, and one provider 130, the disclosed embodiments support any number of computers, databases, devices, consumers, and providers connected via network 106. Also note that although one node is shown as a single and independent entity, in one embodiment, the functions of each node may be integrated with another entity. Further, device 150 and its functionality, according to a preferred embodiment, can be realized in a centralized fashion in one computing device or in a distributed fashion wherein different elements are spread across several interconnected computing devices.

Figure 1B:
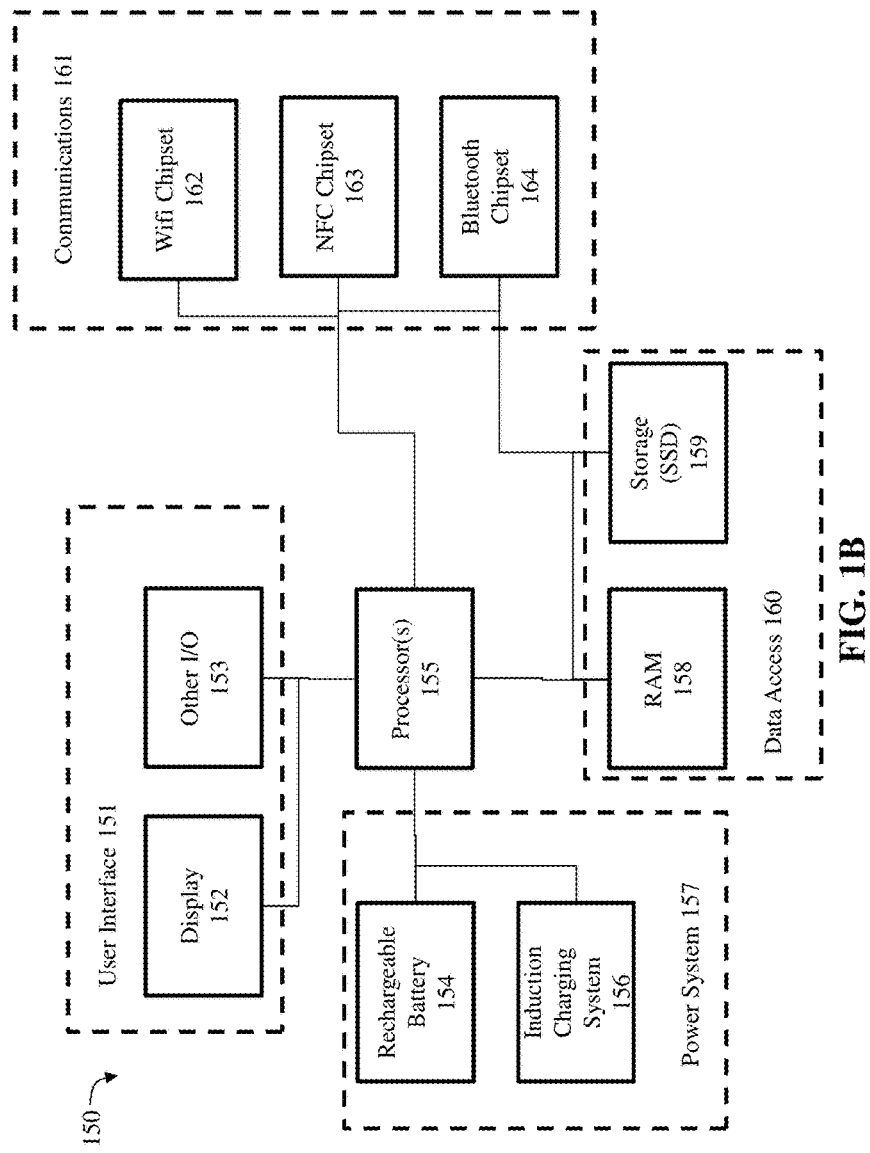
FIG. 1B is a block diagram illustrating the main interior components of the wearable device for storing and managing data, in accordance with one embodiment.

FIG. 1B is a block diagram illustrating the main interior components of the wearable device 150 for storing and managing data, in accordance with one embodiment. FIG. 1B shows that the device 150 includes at least one processor 155 or central processing unit (CPU), which is the electronic circuitry within a computing device that carries out the instructions of a computer program by performing the basic arithmetic, logical, control and input/output (I/O) operations specified by the instructions. Processor 155 may be communicatively coupled with groups 151, 157, 160 and 161. The device 150 also includes a communications processing chip group 161, which comprises network processor or chipset 162, a WiFi communications processor configured for wirelessly transmitting and receiving data over radio frequency signals defined by the IEEE 802.11 standard. A network processor is an integrated circuit which has a feature set specifically targeted at the networking application domain. A chipset is a set of electronic components in an integrated circuit that manages the data flow between the processor, memory and peripherals, wherein the chipset is usually found on the motherboard. Communications processing chip group 161 also comprises network processor or chipset 163, a Near Field Communication (NFC) communications processor configured for wirelessly transmitting and receiving data over radio frequency signals defined by the ISO/IEC 18092 standard. Communications processing chip group 161 also comprises network processor or chipset 164, a Bluetooth communications processor configured for wirelessly transmitting and receiving data over radio frequency signals defined by the IEEE 802.15.1 standard.

FIG. 1B shows that the device 150 also includes data access group 160 comprising non-volatile data storage 159, such as a hard drive, floppy drive, ROM, flash memory, solid state drive, magnetic tape, EPROM, FRAM, MRAM, etc. Data storage 159 may also be NOR flash, NAND flash, vertical NAND and the like. Data storage 159 may also be a RAID array (redundant array of independent disks), which is a data storage virtualization technology that combines multiple physical disk drive components into a single logical unit for the purposes of data redundancy, performance improvement, or both. FIG. 1B shows that data access group 160 comprises volatile data storage 158, such as RAM, SRAM, DRAM, and the like.

FIG. 1B also shows that the device 150 also includes power system group 157 comprising an induction charging system 156 and a rechargeable battery 154. The induction charging system 156 uses an electromagnetic field to transfer energy from an external charging station to the rechargeable battery. Energy is sent through an inductive coupling to system 156, which can then use that energy to charge rechargeable battery 154. The rechargeable battery 154 is a type of electrical battery which can be charged, discharged into a load, and recharged many times, including lead-acid, nickel cadmium (NiCd), nickel metal hydride (NiMH), lithium ion (Li-ion), aluminum ion, and lithium ion polymer (Li-ion polymer) batteries.

FIG. 1B also shows that the device 150 also includes user interface group 151 comprising a display 152 and other input/output (I/O) devices 153. Display 152 may be a touchscreen, which is an input device normally layered on the top of an electronic visual display of an information processing system. A user can give input or control the information processing system through simple or multi-touch gestures by touching the screen with a special stylus/pen and-or one or more fingers. The other input/output (I/O) devices 153 may include a mouse, microphone, keyboard, etc.

In one embodiment, RAM 158 comprises 2 gigabytes of memory. 2 gigabytes as a size is significant because, on average, the minimum memory size for high performance computing has been determined to be, according to studies, 2 gigabytes. Thus, in order to quickly and easily access, organize, read and store standard size portions of data, at least 2 gigabytes of memory is required. This amount of data is also significant because currently the cost memory is about $1.30 per 100 megabytes, which makes the cost of 2 gigabytes of memory highly affordable to purchase, even in large quantities.

Also, in one embodiment, storage 159 comprises 30 gigabytes of storage. 30 gigabytes as a size is significant because, on average, the minimum size of data storage needed for long term consumer needs has been determined to be, according to studies, 30 gigabytes. Thus, in order to be able to access, store, and manage standard size portions of data, at least 30 gigabytes of data storage is needed.

Figure 1C:
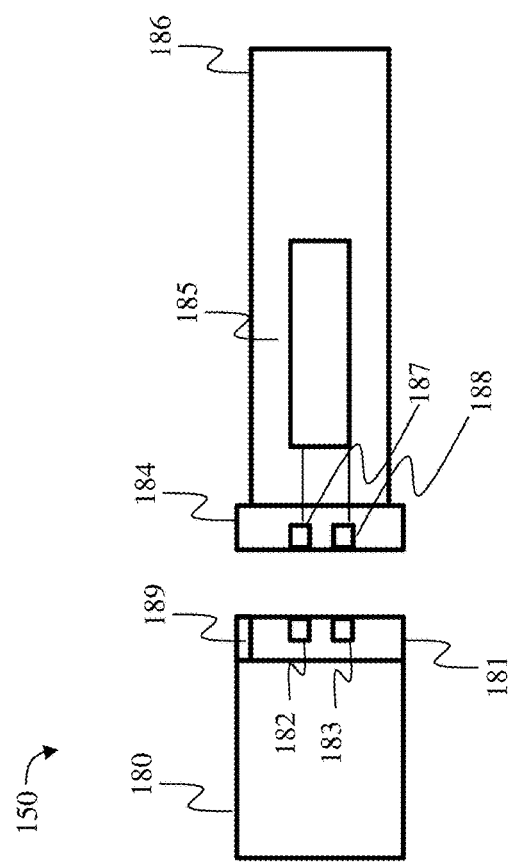
FIG. 1C is a block diagram illustrating certain components of the wearable device for storing and managing data, in accordance with one embodiment.

FIG. 1C is a block diagram illustrating certain components of the wearable device 150 for storing and managing data, in accordance with one embodiment. The wearable computing device includes a wristband 186 including a hermetically sealed rechargeable battery 185 within said wristband, a ferromagnetic shaft 184 coupled to one end of the wristband, the shaft shaped for removable insertion into a cylinder 181 (attached to the case 180 of the device 150), two terminals 187, 188 conductively coupled with the battery, and extending to the shaft 184, such that the two terminals are exposed on an external surface of the shaft 184 and a case 180 comprising a waterproof housing. The case 180 is configured for holding a cylinder 181 shaped for securely inserting the shaft into said cylinder, the cylinder 181 comprising at least one magnet 189 for attracting the shaft, and two terminals 182, 183 for making a conductive connection with the two terminals 187, 188 conductively coupled with the battery 185 when the shaft 184 is inserted into the cylinder. The two terminals 182, 183 are conductively coupled to the device 150, such that the power from battery 185 may power the device 150.

Figure 2:
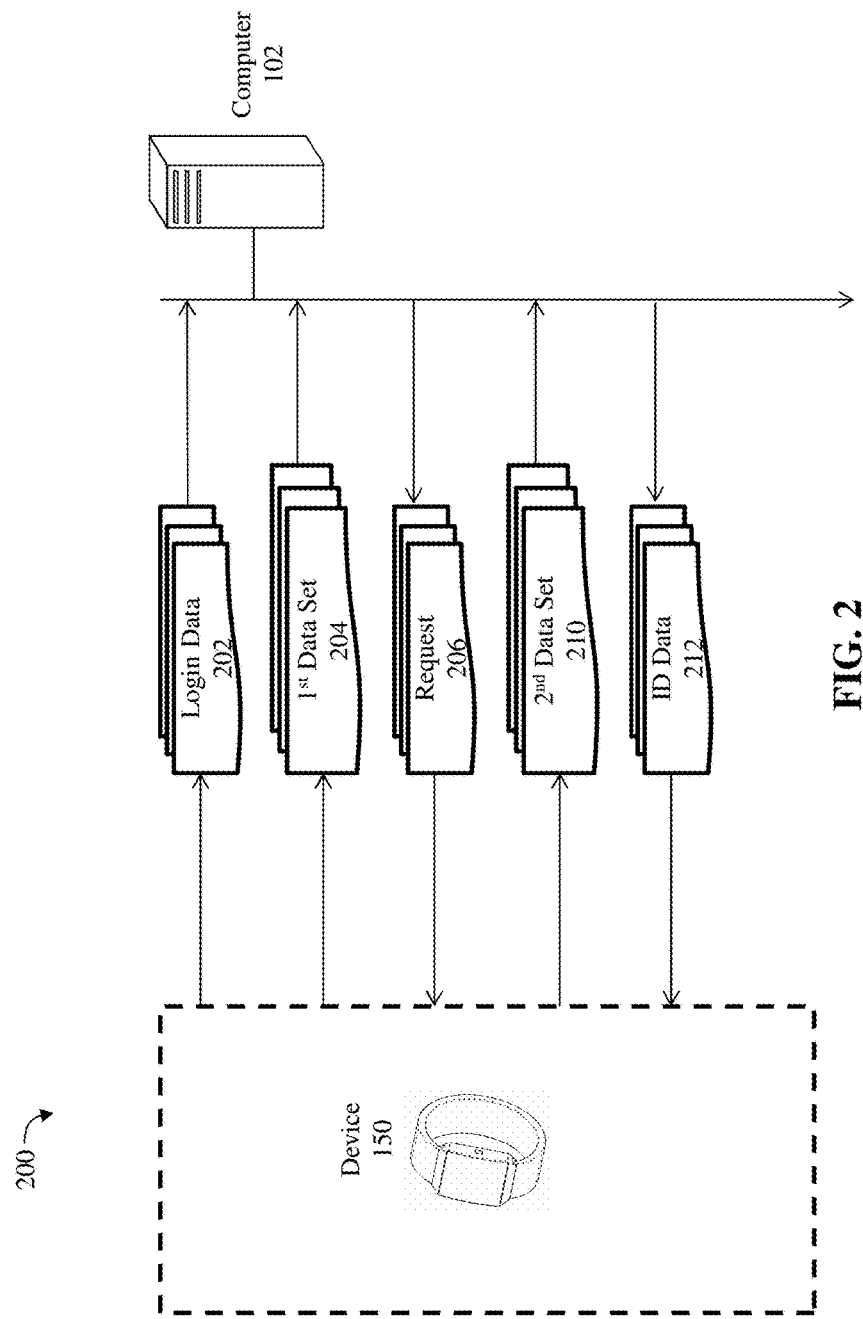
FIG. 2 is a block diagram illustrating the data flow of the process for managing and storing data using the wearable device for storing and managing data, in accordance with one embodiment.
Figure 3A:
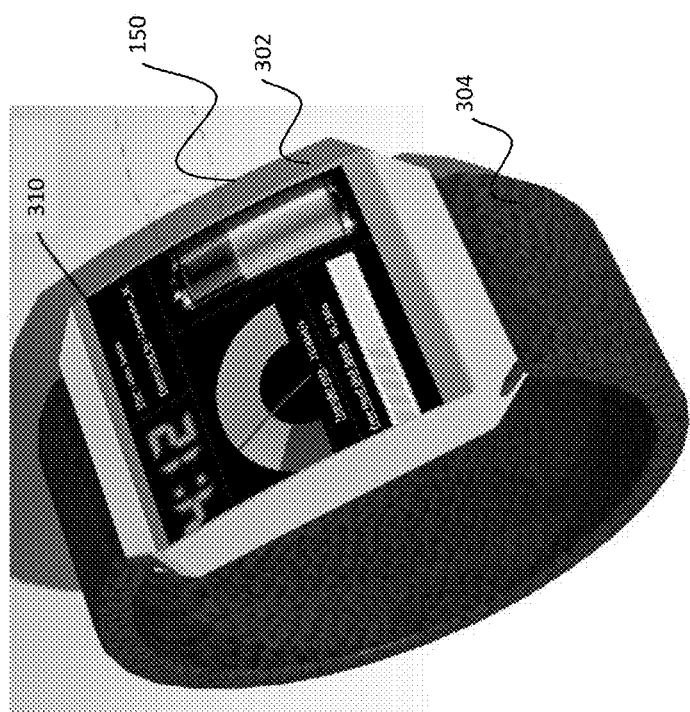
FIGS. 3A-3D are renderings different embodiments of a wearable device for storing and managing data.
Figure 3B:
Figure 3C:
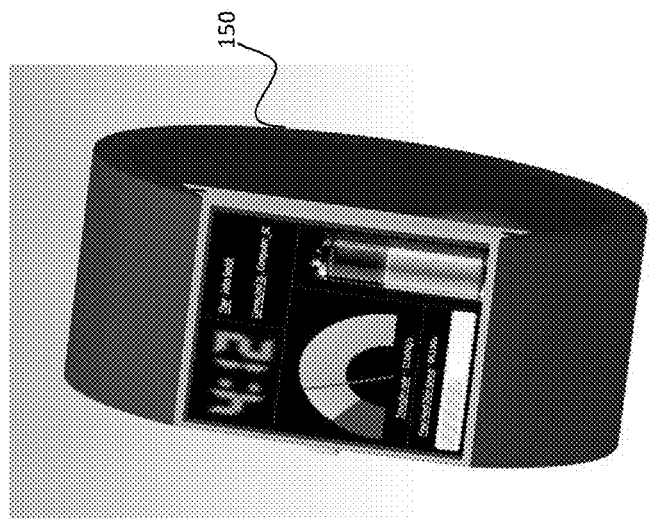
Figure 3D:
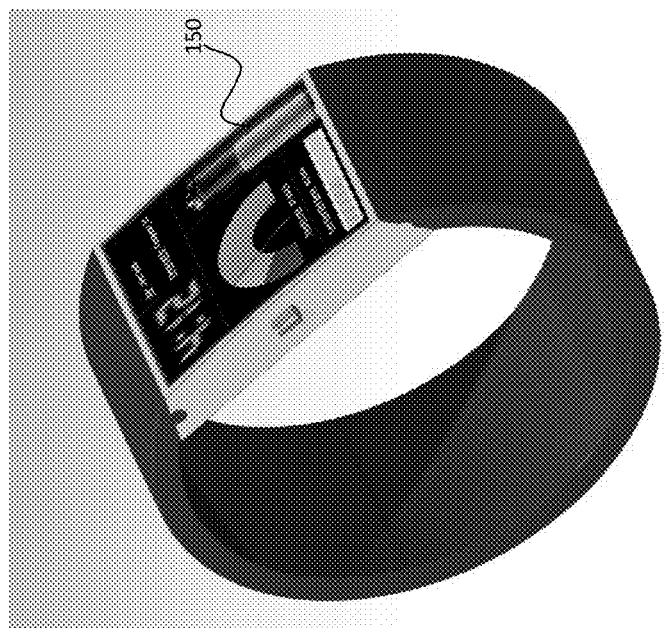

The process of managing and/or storing data on device 150 will now be described with reference to FIG. 2 below. FIG. 2 is a block diagram illustrating the data flow of the process for managing and storing data using the wearable device 150 for storing and managing data, in accordance with one embodiment. FIG. 2 depicts, among other things, the data flow and control flow in the process for managing and storing data using device 150, according to one embodiment. The process of the disclosed embodiments begins when the device 150 (and optionally computer 102) stores one or more consumer records in the database of device 150 (or database 104). Subsequently, the device 150 performs any necessary processing of the data in the database, such as indexing, compressing, organizing, etc. In one example, when recording a record, the device 150 includes direct references and/or linked lists among records, thereby avoiding map lookup at runtime. In another example, when recording a record, the device 150 transforms records into compressed structures.

Next, the consumer 112 uses his device 150 to initiate a transfer of data to and from the computer 102 via network 106 or via a direct connection to computer 102. The connection between the device 150 and the network 106, or computer 102, is wireless and employs the use of the wireless communications group 161. Said transfer of data is accomplished by the execution of instructions by the processor 155.

The consumer 112 may enter login data 202 (such as any of the data in a consumer record) into a graphical user interface (GUI) in his device 150. This login data serves to authenticate the user 112. The login data may also be sent to computer 102. Next, device 150 or computer 102 authenticates the consumer 112 by comparing the login data 202 to the login data that is present in the consumer record in the relevant database that corresponds to the consumer 112. This step entails the device 150 or computer 102 using the login data 202 to determine which consumer record in the relevant database corresponds to the login data 202 and then accessing said consumer record to perform the comparison above.

Next, device 150 transmits a first data set 204 from device 150 via the wireless communications group 161 to the computer 102. Next, the computer 102 stores said first data set in its database 104. Then, computer 102 sends a request 206 for a second data set from the device 150. The communications group 161 receives said request 206. In response, the device 150 accesses the second data set 210 from the data storage device, and sends the second data set 210 to the computer 102 via the wireless communications group 161. In one optional step, the computer 102 may send identifying data 212 to device 150 wirelessly, wherein said identifying data may include that data that identifies the computer, such as a computer name, user name, owner name, type of computer, method of communication, etc. This identifying data 212 may be stored by the device 150 and later displayed in the display.

It should be noted that processor 155 is configured to receive external node (i.e., computer 102) identifying data from the wireless communications group 161, and receive status data from the wireless communications group 161, the data access group 160, the power system 157 and the user interface 151. The status data received from the wireless communications group 161 comprises, among other things, a percentage completed of a data transfer operation, as well identifying data for the external node to which the device 15 is connected. Also, the status data received from the data access group 160 comprises, among other things, an amount of storage space remaining on the data storage device. Further, the status data received from the power system 157 comprises, among other things, a battery level indicator. It should also be noted that the touch-sensitive display may also receive external node identifying data and status data from the processor, wherein the display is configured to display a current time, said external node identifying data and said status data.

FIGS. 3A-3D are renderings of different embodiments of a wearable device 150 for storing and managing data. The renderings show that the device 150 includes a case 302, which acts as a waterproof or hermetic housing for the interior components of the device, and a wristband 304, which may be comprised of rubber, plastic, carbon fiber, alloys, leather, metal or any combination of the above. The cases also shows a touch screen 310 which displays certain information, such as the current time, the name of the current user, the identification data for the computer with which the device 150 is connected, a current battery charge status, and current free space indicator, and a current transfer rate of data to or from the device 150 and the computer with which the device 150 is connected.

FIGS. 4A-4E are renderings of the wearable device 150 for storing and managing data, during the fastening process, in accordance with one embodiment. The renderings show that the device 150 includes a case 302 and a wristband 304. The wristband includes a hermetically sealed rechargeable battery (not shown) within said wristband. The device 150 includes a first ferromagnetic shaft 402 coupled to a first end of the wristband, the first shaft shaped for removable insertion into a cylinder 412 in the case. The device 150 also includes a second ferromagnetic shaft 404 coupled to a second end of the wristband, the second shaft shaped for removable insertion into a second cylinder 414 in the case. The device 150 also includes two terminals 411 conductively coupled with the battery, and extending to the first shaft 402, such that the terminals are exposed on an external surface of the first shaft 402.

Figure 5:
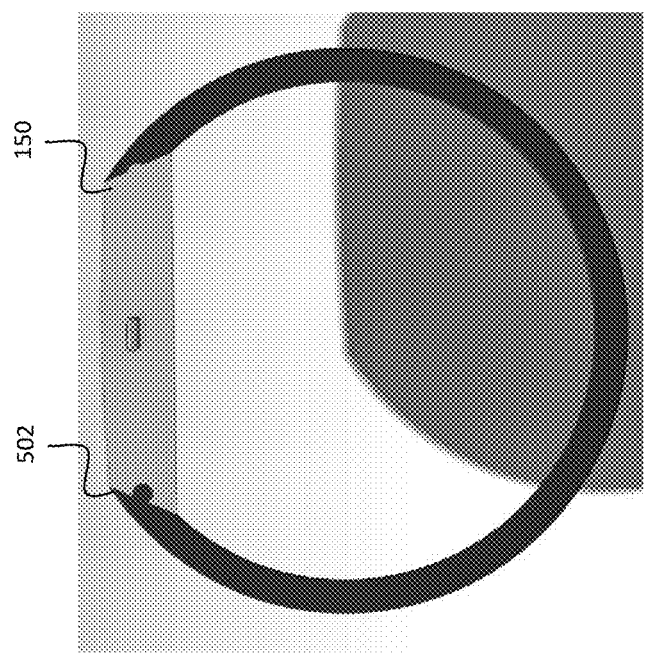
FIG. 5 is a side view of a wearable device for storing and managing data, in accordance with one embodiment.

The first cylinder 412 is located on a first end of the case, the first cylinder shaped for securely inserting one end 413 of the first shaft 402 into said first cylinder, the first cylinder comprising at least one magnet 421 for attracting the first shaft, and at least one terminal 420 for making a conductive connection with the terminals 411 conductively coupled with the battery when the first shaft is inserted into the first cylinder. The magnet 421 of the cylinder 412 serves to pull the shaft 402 further into the cylinder towards the side indicated by 417. The second cylinder 414 is located on a second end of the case, the second cylinder shaped for securely inserting one end 413 of the second shaft into said second cylinder, the second cylinder comprising at least one magnet for attracting the second shaft. The magnet of the cylinder 412 serves to pull the shaft 404 further into the cylinder towards the side indicated by 417. FIG. 4E shows the shafts removed from the cylinders, while FIG. 4C shows the shafts just slightly inserted into the cylinders, FIG. 4B shows the shafts further inserted into the cylinders and FIG. 4A shows the shafts fully inserted into the cylinders. FIG. 5 is a side view of the wearable device 150 for storing and managing data, in accordance with one embodiment. The embodiment shown in FIG. 5 shows an embodiment wherein only one end 502 of the case includes a cylinder for insertion of the shaft on one end of the wristband.

Figure 6B:
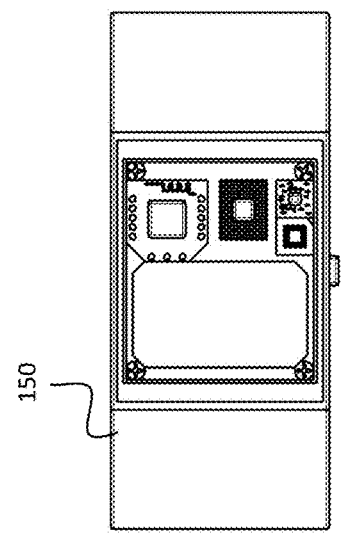
FIGS. 6A-6B are illustrations of various views of a wearable device for storing and managing data, showing certain interior components, in accordance with one embodiment.
Figure 6A:
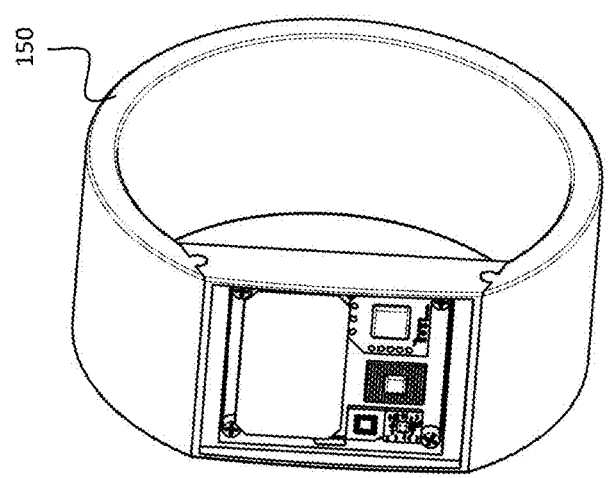

FIGS. 6A-6B are illustrations of various views of the wearable device 150 for storing and managing data, showing certain interior components, in accordance with one embodiment. FIG. 6A is a perspective view, while FIG. 6B is a frontal view, of the device 150 showing certain interior components of the device.

FIGS. 7A-7F are illustrations of various views of the wearable device 150 for storing and managing data, in accordance with one embodiment. FIG. 7A is a rear view of the device 150 while FIG. 7B is a top view and FIG. 7C is a right side view. FIG. 7D is a frontal view of the device 150 while FIG. 7E is a bottom view and FIG. 7F is a perspective front view.

FIGS. 8A-8F are illustrations of various views of the case 302 of wearable device 150 for storing and managing data, showing certain interior components, in accordance with one embodiment. FIG. 8A is a left side view of the case 302 of device 150 while FIG. 8B is a top view and FIG. 8C is a front view. FIG. 8D is a right side view of the case 302 of device 150 while FIG. 8E is a bottom view and FIG. 8F is a perspective front view of the case 302 of device 150 showing certain interior components.

FIGS. 9A-9F are illustrations of various views of the wearable device 150 for storing and managing data, showing certain interior components, in accordance with one embodiment. FIG. 9A is a left side view of the device 150 while FIG. 9B is a bottom view and FIG. 9C is a front view. FIG. 9D is a top view of the device 150 while FIG. 9E is a right side view and FIG. 9F is a perspective front view of the device 150 showing certain interior components.

FIGS. 10A-10F are illustrations of various views of the wearable device 150 for storing and managing data, showing certain interior components, in accordance with one embodiment. FIG. 10A is a rear view of the device 150 while FIG. 10B is a top view and FIG. 10C is a right side view. FIG. 10D is a bottom view of the device 150 while FIG. 10E is a perspective front view and FIG. 10F is a front view of the device 150 showing certain interior components. FIGS. 10A-10F also show that the device 150 includes a button 1002 on the case 302, wherein the button may be used to turn the device or screen on and off, and/or reset the device 150.

Figure 11:
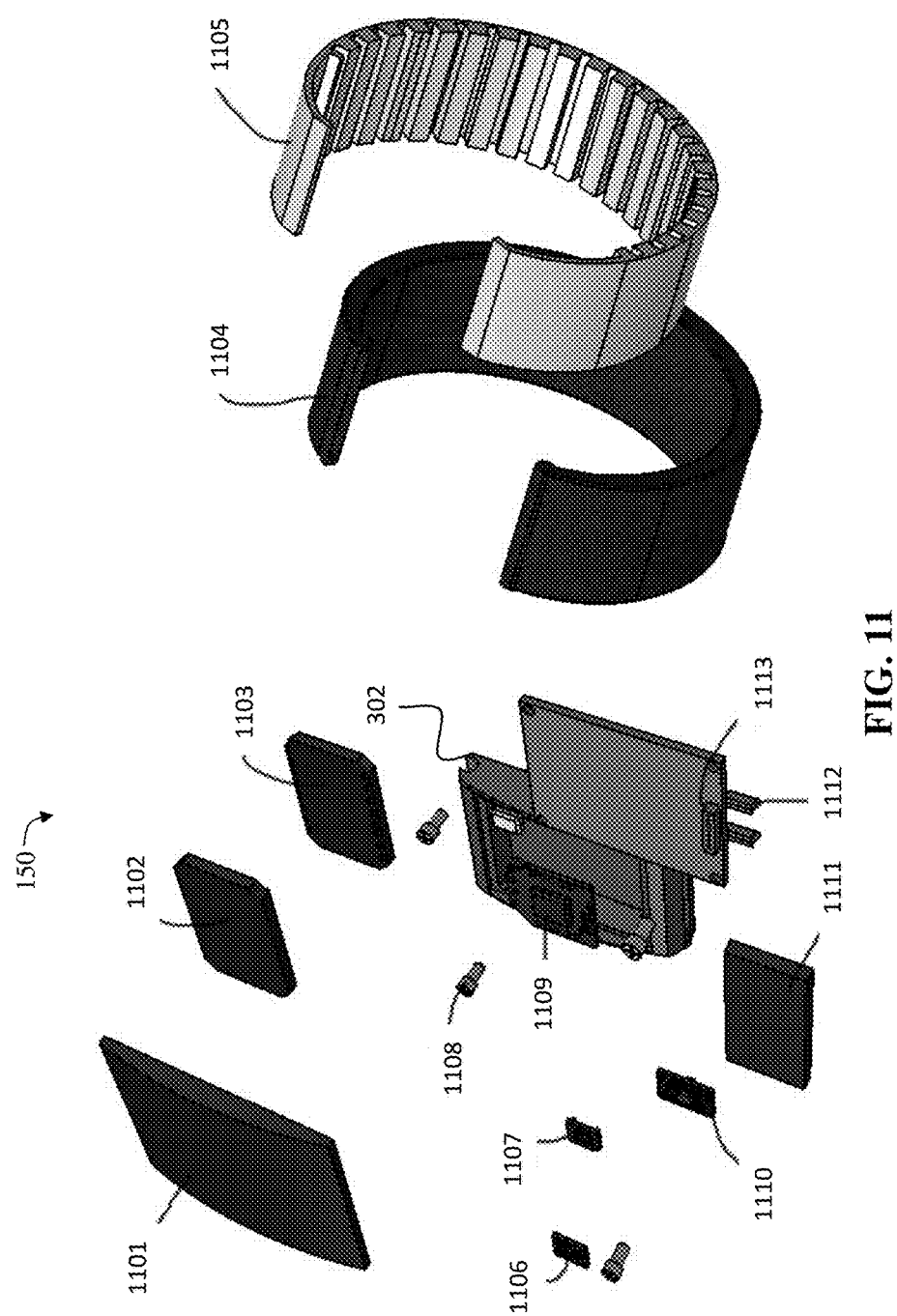
FIG. 11 is an exploded view of a wearable device for storing and managing data, in accordance with one embodiment.

FIG. 11 is an exploded view of the wearable device 150 for storing and managing data, in accordance with one embodiment. FIG. 11 shows the screen or display 1101, hard drive or storage 1102, motherboard 1103, wristband 1104, rechargeable battery 1105, WiFi chipset 1106, NFC chipset 1107, screw 1108, Bluetooth chipset 1109, processor 1110, induction charging system 1111, a terminal 1112 for the case 302 and screen or display connector 1113.

Figure 12:
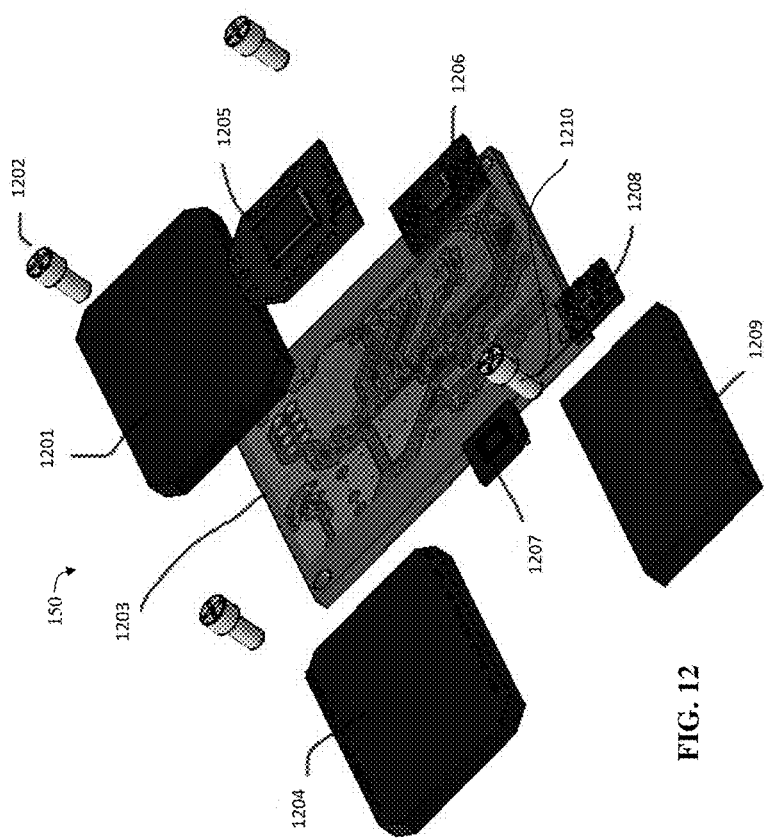
FIG. 12 is an exploded view of the interior components of a wearable device for storing and managing data, in accordance with one embodiment.
Figure 13:
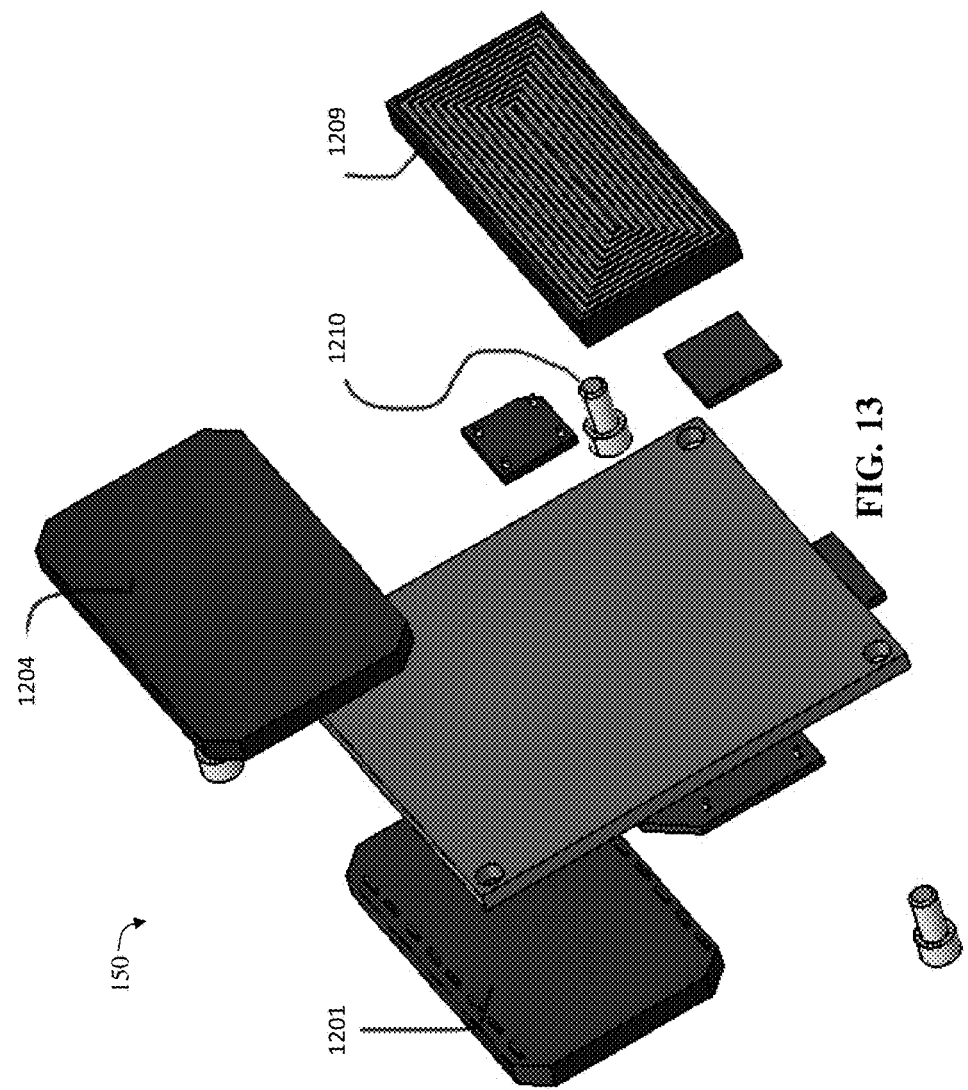
FIG. 13 is another exploded view of the interior components of a wearable device for storing and managing data, in accordance with one embodiment.

FIG. 12 is an exploded view of the interior components of the wearable device 150 for storing and managing data, in accordance with one embodiment. FIG. 12 shows the hard drive or storage 1201, screws 1202, 1210, motherboard 1203, more hard drive or storage 1204, processors 1205, 1206, NFC chipset 1207, WiFi chipset 1208, and induction charging system 1209. FIG. 13 is another exploded view of the interior components of the wearable device 150 for storing and managing data, in accordance with one embodiment. FIG. 13 shows the opposite side shown in FIG. 12.

Figure 14:
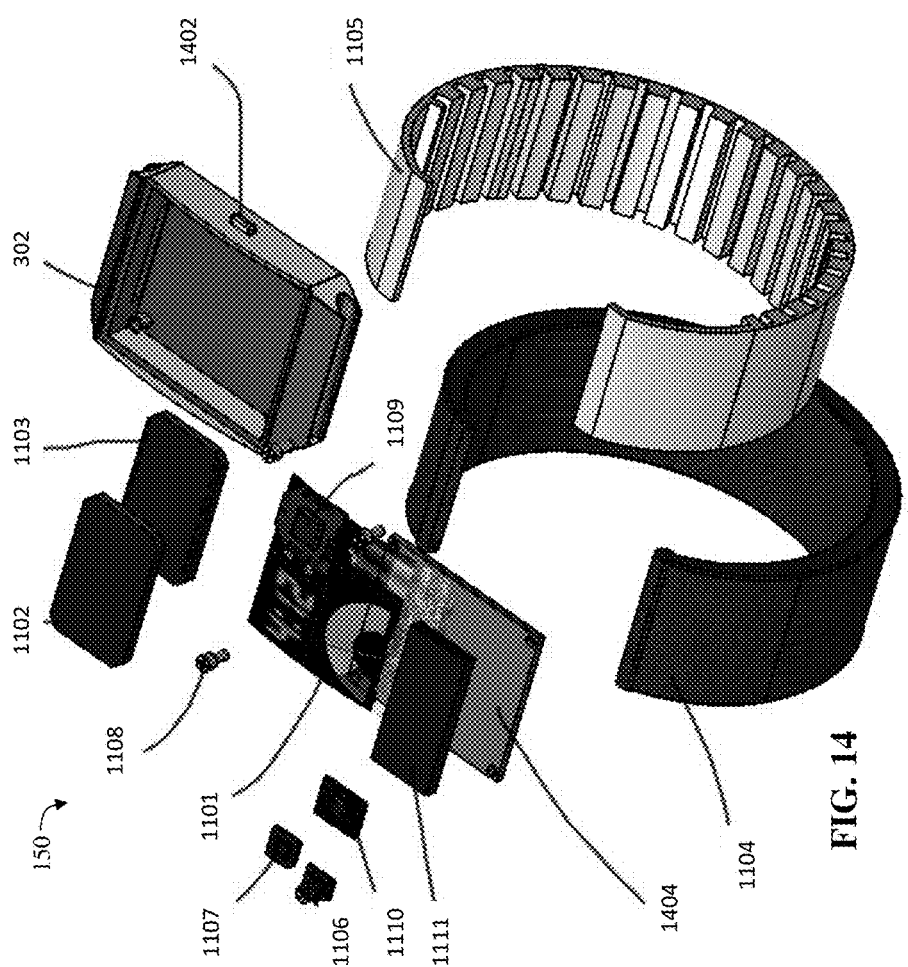
FIG. 14 is an exploded view of a wearable device for storing and managing data, in accordance with one embodiment.

FIG. 14 is an exploded view of a wearable device for storing and managing data, in accordance with one embodiment. FIG. 14 shows a similar view to that shown in FIG. 11. Many of the same components shown in FIG. 11 are also shown in FIG. 14. Also shown in FIG. 14 are the button 1402 and the motherboard 1404.

Figure 15:
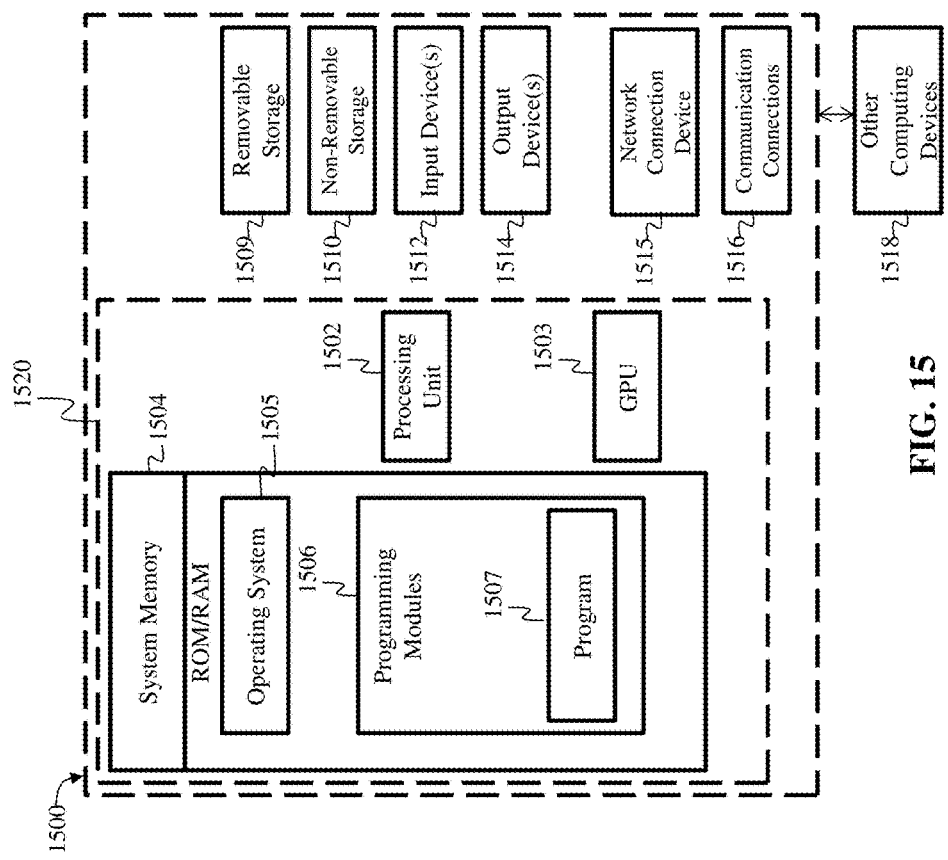
FIG. 15 is a block diagram of a system including an example computing device and other computing devices.

FIG. 15 is a block diagram of a system including an example computing device 1500 and other computing devices. Consistent with the embodiments described herein, the aforementioned actions performed by device 150, may be implemented in a computing device, such as the computing device 1500 of FIG. 15. Any suitable combination of hardware, software, or firmware may be used to implement the computing device 1500. The aforementioned system, device, and processors are examples and other systems, devices, and processors may comprise the aforementioned computing device. Furthermore, computing device 1500 may comprise an operating environment for the methods shown in FIG. 2 above.

With reference to FIG. 15, a system consistent with an embodiment may include a plurality of computing devices, such as computing device 1500. In a basic configuration, computing device 1500 may include at least one processing unit 1502 and a system memory 1504. Depending on the configuration and type of computing device, system memory 1504 may comprise, but is not limited to, volatile (e.g. random access memory (RAM)), non-volatile (e.g. read-only memory (ROM)), flash memory, or any combination or memory. System memory 1504 may include operating system 1505, one or more programming modules 1506 (such as program module 1507). Operating system 1505, for example, may be suitable for controlling computing device 1500's operation. In one embodiment, programming modules 1506 may include, for example, a program module 1507. Furthermore, the disclosed embodiments may be practiced in conjunction with a graphics library, other operating systems, or any other application program and is not limited to any particular application or system. This basic configuration is illustrated in FIG. 15 by those components within a dashed line 1520.

Computing device 1500 may have additional features or functionality. For example, computing device 1500 may also include additional data storage devices (removable and/or non-removable) such as, for example, magnetic disks, optical disks, or tape. Such additional storage is illustrated in FIG. 15 by a removable storage 1509 and a non-removable storage 1510. Computer storage media may include volatile and nonvolatile, removable and non-removable media implemented in any method or technology for storage of information, such as computer readable instructions, data structures, program modules, or other data. System memory 1504, removable storage 1509, and non-removable storage 1510 are all computer storage media examples (i.e. memory storage.) Computer storage media may include, but is not limited to, RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store information and which can be accessed by computing device 1500. Any such computer storage media may be part of device 1500. Computing device 1500 may also have input device(s) 1512 such as a keyboard, a mouse, a pen, a sound input device, a camera, a touch input device, etc. Output device(s) 1514 such as a display, speakers, a printer, etc. may also be included. The aforementioned devices are only examples, and other devices may be added or substituted.

Computing device 1500 may also contain a communication connection 1516 that may allow device 1500 to communicate with other computing devices 1518, such as over a network in a distributed computing environment, for example, an intranet or the Internet. Communication connection 1516 is one example of communication media. Communication media may typically be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media. The term computer readable media as used herein may include both computer storage media and communication media.

Device 1515 may be a network connection device or network interface device (also known as a network interface card, network adapter, LAN adapter, and by similar terms), which is a computer hardware component that connects a computer to a computer network. The network interface device implements the electronic circuitry required to communicate using a specific physical layer and data link layer standard such as Ethernet, Wi-Fi or Token Ring. This provides a base for a full network protocol stack, allowing communication among small groups of computers on the same LAN and large-scale network communications through routable protocols, such as IP.

As stated above, a number of program modules and data files may be stored in system memory 1504, including operating system 1505. While executing on processing unit 1502, programming modules 1506 may perform processes including, for example, one or more of the methods shown in FIGS. 2-3B above. Computing device 1502 may also include a graphics processing unit 1503, which supplements the processing capabilities of processor 1502 and which may execute programming modules 1506, including all or a portion of those processes and methods shown in FIG. 2 above The aforementioned processes are examples, and processing units 1502, 1503 may perform other processes. Other programming modules that may be used in accordance with the disclosed embodiments may include electronic mail and contacts applications, word processing applications, spreadsheet applications, database applications, slide presentation applications, drawing or computer-aided application programs, etc.

Generally, consistent with the disclosed embodiments, program modules may include routines, programs, components, data structures, and other types of structures that may perform particular tasks or that may implement particular abstract data types. Moreover, the disclosed embodiments may be practiced with other computer system configurations, including hand-held devices, multiprocessor systems, microprocessor-based or programmable consumer electronics, minicomputers, mainframe computers, and the like. Embodiments may also be practiced in distributed computing environments where tasks are performed by remote processing devices that are linked through a communications network. In a distributed computing environment, program modules may be located in both local and remote memory storage devices.

Furthermore, the disclosed embodiments may be practiced in an electrical circuit comprising discrete electronic elements, packaged or integrated electronic chips containing logic gates, a circuit utilizing a microprocessor, or on a single chip (such as a System on Chip) containing electronic elements or microprocessors. The disclosed embodiments may also be practiced using other technologies capable of performing logical operations such as, for example, AND, OR, and NOT, including but not limited to mechanical, optical, fluidic, and quantum technologies. In addition, the disclosed embodiments may be practiced within a general purpose computer or in any other circuits or systems.

The disclosed embodiments, for example, are described above with reference to block diagrams and/or operational illustrations of methods, systems, and computer program products according to the disclosed embodiments. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While certain disclosed embodiments have been described, other embodiments may exist. Furthermore, although the disclosed embodiments have been described as being associated with data stored in memory and other storage mediums, data can also be stored on or read from other types of computer-readable media, such as secondary storage devices, like hard disks, floppy disks, or a CD-ROM, or other forms of RAM or ROM. Further, the disclosed methods' stages may be modified in any manner, including by reordering stages and/or inserting or deleting stages, without departing from the disclosed embodiments.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:
1. A wearable computing device for storing and managing data, the wearable computing device comprising:
 (I) a wristband including a hermetically sealed rechargeable battery within said wristband;
 (II) a ferromagnetic shaft coupled to one end of the wristband, the shaft having a cylinder shape for removable insertion into a cylindrical shaped void, the cylindrical shaped shaft having a curved wall and two ends;
 (III) at least one terminal conductively coupled with the battery, and extending to the shaft, such that the at least one terminal is exposed on an external surface of the curved wall of the shaft;
 (IV) a case comprising a waterproof housing configured for holding:
  (A) a cylindrical shaped void configured for securely inserting an entirety of the shaft into said void, the void comprising an interior curved wall, two ends, at least one magnet for attracting the shaft, and at least one terminal located on the interior curved wall for making a conductive connection with the at least one terminal conductively coupled with the battery when the shaft is inserted in its entirety into the void;

(B) a first communications processor configured for wirelessly transmitting and receiving data over radio frequency signals defined by the IEEE 802.11 standard;

(C) a second communications processor configured for wirelessly transmitting and receiving data over radio frequency signals defined by the IEEE 802.15.1 standard;

(D) a third communications processor configured for wirelessly transmitting and receiving data over radio frequency signals defined by the ISO/IEC 18092 standard;

(E) a memory element comprising at least 2 gigabytes of memory;

(F) a data storage device comprising at least 30 gigabytes of data storage;

(G) an inductive charging system conductively coupled with the battery when the shaft is inserted in its entirety into the void, such that the inductive charging system wirelessly receives charge from an external power source and recharges the battery; and (H) a processor conductively coupled with the first, second and third communications processor, the memory element, the data storage element, and the battery, wherein the processor is configured for:

(a) receiving a first data set from the first, second or third communications processors, wherein said first data set originated from an external node, and storing said first data set in the data storage device;

(b) accessing a second data set from the data storage device, in response to a request for said second data set from the first, second or third communications processors, and sending said second data set to the first, second or third communications processors, wherein the said second data set is wirelessly transmitted by the first, second or third communications processors to an external node; and (c) receiving status data from the first, second and third communications processors, the data storage device, and the battery; and (V) a touch-sensitive display located on an external surface of the case, the display conductively coupled with the battery and the processor so as to receive status data from the processor, wherein the display is configured to display said status data.

2. The wearable computing device of claim 1, wherein the at least one terminal conductively coupled with the battery comprises two terminals.

3. The wearable computing device of claim 2, wherein the at least one terminal of the void comprises two terminals for making a conductive connection with the two terminals conductively coupled with the battery when the shaft is inserted into the void in its entirety.

4. The wearable computing device of claim 3, wherein the memory element comprises static RAM or dynamic RAM.

5. The wearable computing device of claim 4, wherein the data storage device comprises a solid state drive.

6. The wearable computing device of claim 5, wherein the data storage device comprises flash memory.

7. The wearable computing device of claim 6, wherein the status data received from the first, second and third communications processors comprises a percentage completed of a data transfer operation, wherein the status data received from the data storage device comprises an amount of storage space remaining on the data storage device, and wherein the status data received from the battery comprises a battery level indicator.

8. A wearable computing device for storing and managing data, the wearable computing device comprising:

(I) a wristband including a hermetically sealed rechargeable battery within said wristband;

(II) a first ferromagnetic shaft coupled to a first end of the wristband, the first shaft having a cylinder shape for removable insertion into a cylindrical shaped void, the cylindrical shaped shaft having a curved wall and two ends;

(III) a second ferromagnetic shaft coupled to a second end of the wristband, the second shaft having a cylinder shape for removable insertion into a cylindrical shaped void;

(IV) at least one terminal conductively coupled with the battery, and extending to the first shaft, such that the at least one terminal is exposed on an external surface of the curved wall of the first shaft;

(V) a case comprising a waterproof housing configured for holding:

(A) a first cylindrical shaped void located on a first end of the case, the first cylindrical shaped void configured for securely inserting an entirety of the first shaft into said first void, the first void comprising an interior curved wall, two ends, at least one magnet for attracting the first shaft, and at least one terminal located on the interior curved wall of the first void for making a conductive connection with the at least one terminal conductively coupled with the battery when the first shaft is inserted in its entirety into the first void;

(B) a second cylindrical shaped void located on a second end of the case, the second void shaped for securely inserting an entirety of the second shaft into said second void, the second void comprising at least one magnet for attracting the second shaft;

(C) a first communications processor configured for wirelessly transmitting and receiving data over radio frequency signals defined by the IEEE 802.11 standard;

(D) a second communications processor configured for wirelessly transmitting and receiving data over radio frequency signals defined by the IEEE 802.15.1 standard;

(E) a third communications processor configured for wirelessly transmitting and receiving data over radio frequency signals defined by the ISO/IEC 18092 standard;

(F) a memory element comprising at least 2 gigabytes of memory;

(G) a data storage device comprising at least 30 gigabytes of data storage;

(H) an inductive charging system conductively coupled with the battery when the first shaft is inserted in its entirety into the first void, such that the inductive charging system wirelessly receives charge from an external power source and recharges the battery; and (I) a processor conductively coupled with the first, second and third communications processor, the memory element, the data storage element, and the battery, wherein the processor is configured for:

(a) receiving a first data set from the first, second or third communications processors, wherein said first data set originated from an external node, and storing said first data set in the data storage device;

(b) accessing a second data set from the data storage device, in response to a request for said second data set from the first, second or third communications processors, and sending said second data set to the first, second or third communications processors, wherein the said second data set is wirelessly transmitted by the first, second or third communications processors to an external node; and (c) receiving status data from the first, second and third communications processors, the data storage device, and the battery; and (VI) a touch-sensitive display located on an external surface of the case, the display conductively coupled with the battery and the processor so as to receive status data from the processor, wherein the display is configured to display said status data.

9. The wearable computing device of claim 8, wherein the at least one terminal conductively coupled with the battery comprises two terminals.

10. The wearable computing device of claim 9, wherein the at least one terminal of the first void comprises two terminals for making a conductive connection with the two terminals conductively coupled with the battery when the first shaft is inserted into the first void in its entirety.

11. The wearable computing device of claim 10, wherein the memory element comprises static RAM or dynamic RAM.

12. The wearable computing device of claim 11, wherein the data storage device comprises a solid state drive.

13. The wearable computing device of claim 12, wherein the data storage device comprises flash memory.

14. The wearable computing device of claim 13, wherein the status data received from the first, second and third communications processors comprises a percentage completed of a data transfer operation, wherein the status data received from the data storage device comprises an amount of storage space remaining on the data storage device, and wherein the status data received from the battery comprises a battery level indicator.

15. A wearable computing device for storing and managing data, the wearable computing device comprising:

(I) a wristband including a hermetically sealed rechargeable battery within said wristband;

(II) a ferromagnetic shaft coupled to one end of the wristband, the shaft having a cylinder shape for removable insertion into a cylindrical shaped void, the cylindrical shaped shaft having a curved wall and two ends;

(III) at least one terminal conductively coupled with the battery, and extending to the shaft, such that the at least one terminal is exposed on an external surface of the curved wall of the shaft;

(IV) a case comprising a waterproof housing configured for holding:

(A) a cylindrical shaped void configured for securely inserting an entirety of the shaft into said void, the void comprising an interior curved wall, two ends, at least one magnet for attracting the shaft, and at least one terminal located on the interior curved wall for making a conductive connection with the at least one terminal conductively coupled with the battery when the shaft is inserted in its entirety into the void;

(B) a first communications processor configured for wirelessly transmitting and receiving data over radio frequency signals defined by the IEEE 802.11 standard;

(C) a second communications processor configured for wirelessly transmitting and receiving data over radio frequency signals defined by the IEEE 802.15.1 standard;

(D) a third communications processor configured for wirelessly transmitting and receiving data over radio frequency signals defined by the ISO/IEC 18092 standard;

(E) a memory element comprising at least 2 gigabytes of memory;

(F) a data storage device comprising at least 30 gigabytes of data storage;

(G) an inductive charging system conductively coupled with the battery when the shaft is inserted in its entirety into the void, such that the inductive charging system wirelessly receives charge from an external power source and recharges the battery; and (H) a processor conductively coupled with the first, second and third communications processor, the memory element, the data storage element, and the battery, wherein the processor is configured for:

(a) receiving a first data set from the first, second or third communications processors, wherein said first data set originated from an external node, and storing said first data set in the data storage device;

(b) accessing a second data set from the data storage device, in response to a request for said second data set from the first, second or third communications processors, and sending said second data set to the first, second or third communications processors, wherein the said second data set is wirelessly transmitted by the first, second or third communications processors to an external node; and (c) receiving external node identifying data from the first, second and third communications processors, and receiving status data from the first, second and third communications processors, the data storage device, and the battery; and (V) a touch-sensitive display located on an external surface of the case, the display conductively coupled with the battery and the processor so as to receive external node identifying data and status data from the processor, wherein the display is configured to display a current time, said external node identifying data and said status data.

16. The wearable computing device of claim 15, wherein the at least one terminal conductively coupled with the battery comprises two terminals.

17. The wearable computing device of claim 16, wherein the at least one terminal of the void comprises two terminals for making a conductive connection with the two terminals conductively coupled with the battery when the shaft is inserted into the void in its entirety.

18. The wearable computing device of claim 17, wherein the memory element comprises static RAM or dynamic RAM.

19. The wearable computing device of claim 18, wherein the data storage device comprises a solid state drive.

20. The wearable computing device of claim 19, wherein the data storage device comprises flash memory.

* * * * *